United States Patent
Nagata

[11] Patent Number: 6,028,943
[45] Date of Patent: Feb. 22, 2000

[54] AUDIO AMPLIFIER SYSTEM USING A CLASS D AMPLIFIER

[75] Inventor: Koichiro Nagata, Ibaraki, Japan

[73] Assignee: Matsushita Electric Industrial Co., Ltd., Osaka-fu, Japan

[21] Appl. No.: 09/300,256

[22] Filed: Apr. 27, 1999

[30] Foreign Application Priority Data

Apr. 30, 1998 [JP] Japan .................................. 10-136140

[51] Int. Cl.[7] .................................................... H04R 3/00
[52] U.S. Cl. ........................... 381/111; 381/117; 330/251; 330/207 A
[58] Field of Search .................................... 381/111, 116, 381/117, 120, 123, 98, 1, 402, FOR 155; 330/251, 207 R, 207 A

[56] References Cited

U.S. PATENT DOCUMENTS

| | | | |
|---|---|---|---|
| 4,566,120 | 1/1986 | Nieuwendijk et al. | 381/117 |
| 4,612,420 | 9/1986 | Nieuwendijk et al. | 381/117 |
| 5,160,896 | 11/1992 | McCorkle | 330/251 |
| 5,347,587 | 9/1994 | Takahashi et al. | 381/111 |
| 5,592,559 | 1/1997 | Takahashi et al. | 381/111 |
| 5,789,975 | 8/1998 | Yoshida et al. | 330/207 A |
| 5,898,340 | 4/1999 | Chatterjee et al. | 330/251 |
| 5,909,496 | 6/1999 | Kishigami et al. | 381/111 |

FOREIGN PATENT DOCUMENTS

| | | | |
|---|---|---|---|
| 57-186898 | 11/1982 | Japan | 381/117 |
| 58-31699 | 2/1983 | Japan | 381/155 |
| 4-326291 | 11/1992 | Japan | 381/155 |
| 4-355599 | 12/1992 | Japan | 381/155 |
| 5-160649 | 6/1993 | Japan . | |
| 6-216664 | 8/1994 | Japan . | |
| 6-303049 | 10/1994 | Japan . | |

OTHER PUBLICATIONS

English language abstract of Japanese Publication 5–160649
English language abstract of Japanese Publication 6–303049

*Primary Examiner*—Forester W Isen
*Assistant Examiner*—Xu Mei
*Attorney, Agent, or Firm*—Greenblum & Bernstein, P.L.C.

[57] ABSTRACT

Class D amplifiers are difficult to incorporate into audio amplifier systems because of the interference created by the amplifier and/or the surrounding circuits. The modulation frequencies f1 and f2 of two class D amplifiers in an audio amplifier system are adjusted so that the frequency f1–f2 of interference between the modulation frequencies is outside the reproducible frequency band B1 of speakers converting the class D amplifier output to audible sound. As a result, interference that may result from simultaneous use of two class D amplifiers for similar purposes is inaudible and not perceived as noise.

7 Claims, 4 Drawing Sheets

|f1−f2| > B1

|f1−f2| > B1

|f1−f2| >B1

AUDIO AMPLIFIER SYSTEM USING A CLASS D AMPLIFIER

BACKGROUND OF THE INVENTION

1. Field of the Invention

The present invention relates to a television receiver or other system using a class D amplifier for audio signal amplification.

2. Description of Related Art

Various designs for assuring the performance of a class D amplifier when used alone have been developed as taught in Japan Unexamined Patent Application Publications (kokai) H5-160649, H6-303049, and H6-216664 (corresponding to U.S. Pat. No. 5,160,896). However, when a class D amplifier is used as part of a system such as a television receiver, the fundamental frequency and harmonic components of the pulse width modulation (PWM) signals generated by a conventionally configured class D amplifier create interference with surrounding circuits, thus requiring other anti-interference measures to be taken.

This problem is particularly noticeable when two or more class D amplifiers are used as audio amplifiers for viewing stereo broadcasts. In this case, the fundamental frequency components of the PWM signal from each of the class D amplifiers not only interfere with surrounding circuits, they also interfere with each other and become superposed as an interference signal on the audio output signal, resulting in an audible interference component in the audio output from the speakers.

In addition, when a class D amplifier is used for audio amplification in a television receiver, the fundamental frequency for pulse width modulation in the class D amplifier typically exceeds 100 kHz because the peak audio frequency is typically approximately 20 kHz. A harmonic frequency component therefore extends into the video frequency band. As a result, using a class D amplifier for audio amplification can also result in interference with the video output.

The methods conventionally used to resolve the problems associated with interference produced by a class D amplifier have thus been deficient. The most common method of avoiding the effects of interference from the amplifier has therefore been to individually shield each class D amplifier with a separate shield.

Even this method, however, does not eliminate the actual problem of interference in systems using one or more conventional class D amplifiers, and the above-noted problems thus remain.

SUMMARY OF THE INVENTION

It is therefore an object of the present invention to provide an audio amplifier system using a class D amplifier in which the effects of interference from the class D amplifier are removed.

To achieve this object, an audio amplifier system using a class D amplifier according to the present invention uses two or more class D amplifiers designed such that the frequency of the fundamental frequency component simultaneously generated for pulse width modulation of the amplifier input signals is set so that the interference wave resulting from mutual interference between the fundamental frequency components is in a frequency band outside the usable bandwidth of the circuits, devices, ICs, and other components downstream from the class D amplifier. As a result, there is no adverse effect on the operation of other circuits and components because interference from crosstalk between fundamental frequency components emitted simultaneously by two class D amplifiers occurs in an unused frequency band.

According to the present invention, an audio amplifier system comprises:

a first source for producing a first source signal in a specific frequency band with a maximum frequency B0;

a first class D amplifier which pulse wave modulates and amplifies said first source signal using a clock of a first modulation frequency f1 that is sufficiently high relative to frequency B0, and outputs a first PWM signal;

a first filter for attenuating unwanted frequency components from said first PWM signal;

a first speaker for receiving said first PMW signal and producing a first audible signal in a specific frequency band with a maximum frequency B1;

a second source for producing a second source signal in a specific frequency band with a maximum frequency B0;

a second class D amplifier which pulse wave modulates and amplifies said second source signal using a clock of a second modulation frequency f2 that is sufficiently high relative to frequency B0, and outputs a first PWM signal;

a second filter for attenuating unwanted frequency components from said second PWM signal; and a second speaker for receiving said second PMW signal and producing a second audible signal in a specific frequency band with a maximum frequency B1;

wherein said first and second modulation frequencies f1 and f2 are preselected to satisfy the following relationship $$|f1 f2| > B1$$

whereby no audible interference is reproduced by said first and second speakers.

An audio amplifier system using a class D amplifier according to the present invention further comprises a magnetic shield for the coil used as an inductor of an LC filter used by the class D amplifier, thereby preventing magnetic leakage from the coil. As a result, adverse effects of interference emitted from circuits using the class D amplifier are eliminated.

Further preferably, IC components in which the class D amplifier is incorporated are coated with a magnetic shielding material in an audio amplifier system using a class D amplifier according to the present invention. As a result, adverse effects from interference signals emitted by an IC incorporating a class D amplifier are eliminated.

Other objects and attainments together with a fuller understanding of the invention will become apparent and appreciated by referring to the following description and claims taken in conjunction with the accompanying drawings.

DESCRIPTION OF THE PREFERRED EMBODIMENTS

The preferred embodiments of the present invention are described below with reference to the accompanying figures.

Embodiment 1

Figure 1:
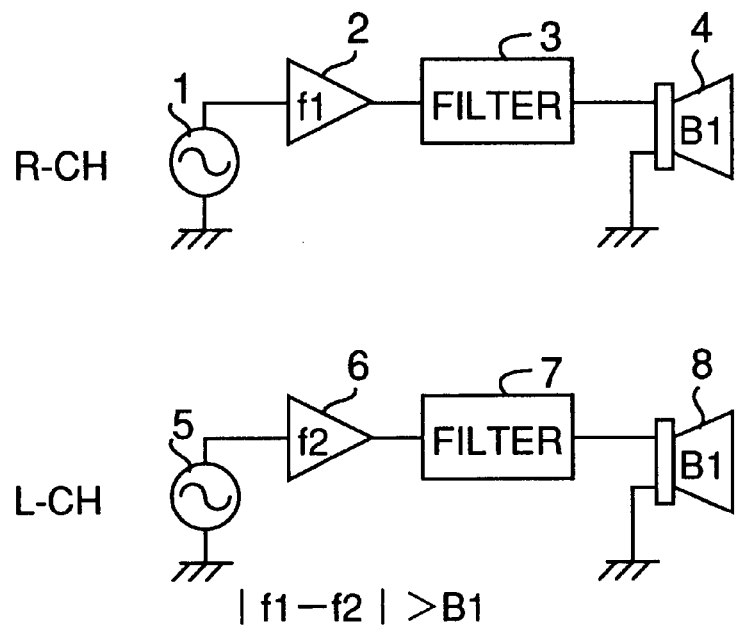
FIG. 1 is a schematic diagram of an audio amplifier system using a class D amplifier according to a first preferred embodiment of the present invention.

FIG. 1 is a schematic diagram of an audio amplifier system using a class D amplifier according to a first preferred embodiment of the present invention. As shown in FIG. 1, this audio amplifier system comprises first and second signal sources 1 and 5; first and second class D amplifiers 2 and 6; first and second integrators 3 and 7; and reproduction devices (speakers) 4 and 8.

The first signal source 1 outputs a source signal of a specific frequency band, such as an audio signal band, with a maximum frequency B0. The first class D amplifier 2 pulse wave modulates and amplifies the input signal from the first signal source 1 at the clock of a modulation frequency f1 that is sufficiently high relative to frequency B0, and outputs the PWM signal. The first integrator 3 integrates the output signal from the first class D amplifier 2, and attenuates unwanted frequency components, such as the operating clock component of the first class D amplifier modulation frequency f1, the harmonic frequency component of the modulation frequency f1, and the frequency component above the reproducible frequency band, with a maximum frequency B1, of the speaker 4. The speaker 4 converts the output signal from the first integrator 3 to an audible signal.

The second signal source 5 likewise outputs a signal of a specific frequency band, such as an audio signal band, with a maximum frequency B0. The second class D amplifier 6 pulse wave modulates and amplifies the input signal from the second signal source 5 at the clock of a modulation frequency f2 that is sufficiently high relative to frequency B0, and outputs the PWM signal. The second integrator 7 integrates the output signal from the second class D amplifier 6, and attenuates the operating clock component of the second class D amplifier modulation frequency f2, the harmonic frequency component of the modulation frequency f2, and the frequency component above the reproducible frequency band, with a maximum frequency B1, of the speaker 8. The speaker 8 converts the output signal from the second integrator 7 to an audible signal.

The system shown in FIG. 1 is thus a stereo system with the components shown in the top in FIG. 1 being a right channel, and those on the bottom being a left channel, in this exemplary embodiment.

The modulation frequency f1 of the first class D amplifier operating clock, and the modulation frequency f2 of the second class D amplifier operating clock, are previously selected so that the difference between frequencies f1 and f2 is above the reproducible frequency B1 of speakers 4 and 8. This relationship is shown below.

$$|f1-f2|>B1$$

As a result, even if the beat component of modulation frequency f1 and modulation frequency f2 produces interference, this interference will not be reproduced by speakers 4 and 8.

If in the exemplary embodiment shown in FIG. 1, modulation frequency f1 is 200 kHz and modulation frequency f2 is 175 kHz, the difference therebetween is 25 kHz and is thus above the 20 kHz, which is an upper limit of the audible frequency range. This means that even if mutual interference between modulation components produces a beat component, this beat component will be in the 25 kHz range, will thus be inaudible to the human ear, and will therefore not be perceived as noise.

In a typical audio amplifier system in which the present invention is deployed, the first signal source 1 and second signal source 5 will be audio signal controllers, the reproduction devices 4 and 8 will be audio speakers, and frequency B0 equals reproducible frequency B1.

Alternatively, the first signal source 1 and second signal source 5 could be bias signal generators, and the reproduction devices 4 and 8 deflection coils. In this case, B0 and B1 may not be equal.

Embodiment 2

Figure 2:
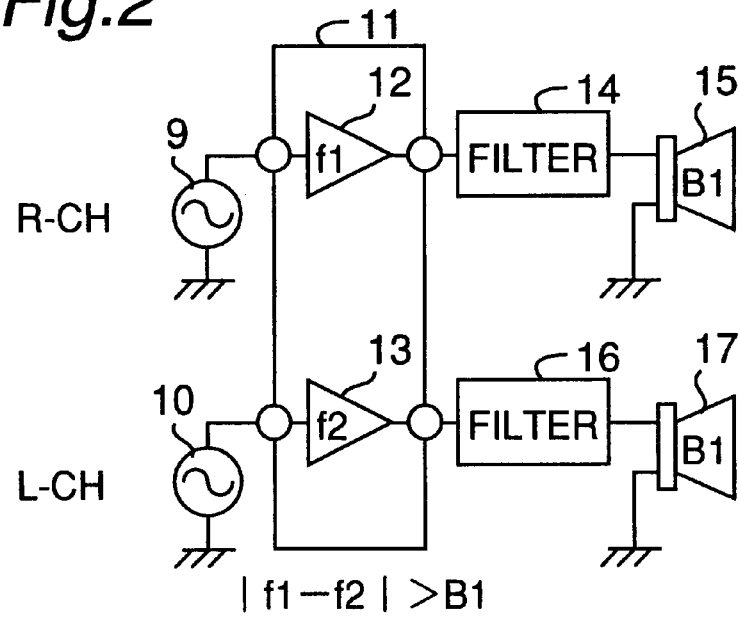
FIG. 2 is a schematic diagram of an audio amplifier system using a class D amplifier according to a second preferred embodiment of the present invention.

FIG. 2 is a schematic diagram of an audio amplifier system using a class D amplifier according to a second preferred embodiment of the present invention. As shown in FIG. 2, this audio amplifier system also comprises first and second signal sources 9 and 10; an IC 11 having internal first and second class D amplifiers 12 and 13; first and second integrators 14 and 16; and reproduction devices (speakers) 15 and 17.

As in the first embodiment, the first and second signal sources 9 and 10 each output a signal of a specific frequency band, such as an audio signal band with a maximum frequency B0, to the corresponding first and second class D amplifiers 12 and 13. The first class D amplifier 12 pulse wave modulates and amplifies the input signal from the first signal source 9 at the clock of a modulation frequency f1 that is sufficiently high relative to frequency B0, and outputs a PWM signal. As in the first embodiment, the second class D amplifier 13 likewise simultaneously modulates and amplifies the input signal using modulation frequency f2 as described above.

The operation of the first integrator 14 is the same as that of the first integrator 3 in the first embodiment, except that it operates on the output signal from the first class D amplifier 12 in the IC 11. The second integrator 16 likewise operates identically to the second integrator 7 in the first embodiment, except that it also operates on the output signal from the second class D amplifier 13 in the IC 11.

The first and second reproduction devices (speakers) 15 and 17 then reproduce the output signals from the corresponding first and second integrators 14 and 16 as audible signals.

It should be noted that while the first class D amplifier 12 and second class D amplifier 13 are both integrated in the IC 11, the modulation frequency f1 of the first class D amplifier 12 and the modulation frequency f2 of the second class D amplifier 13 are still set so that the difference between frequencies f1 and f2 is above the reproducible frequency band B1 of the speakers. As a result, even if the beat component of modulation frequency f1 and modulation frequency f2 produces interference, this interference will not be reproduced by the speakers.

Frequency B0 is also preferably the same as reproducible frequency B1 in this embodiment. However, as also described above, if the signal sources are bias signal generators, and the reproduction devices are deflection coils, B0 and B1 may not be the same.

Embodiment 3

Figure 3:
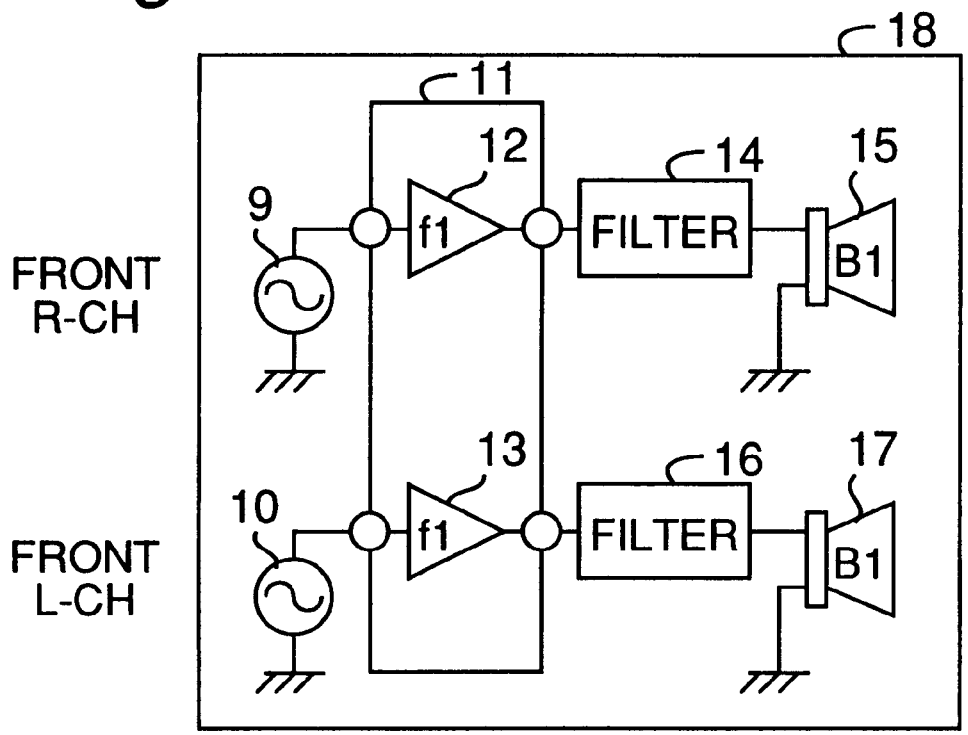
FIG. 3 is a schematic diagram of an audio amplifier system using a class D amplifier according to a third preferred embodiment of the present invention.
Figure 3:
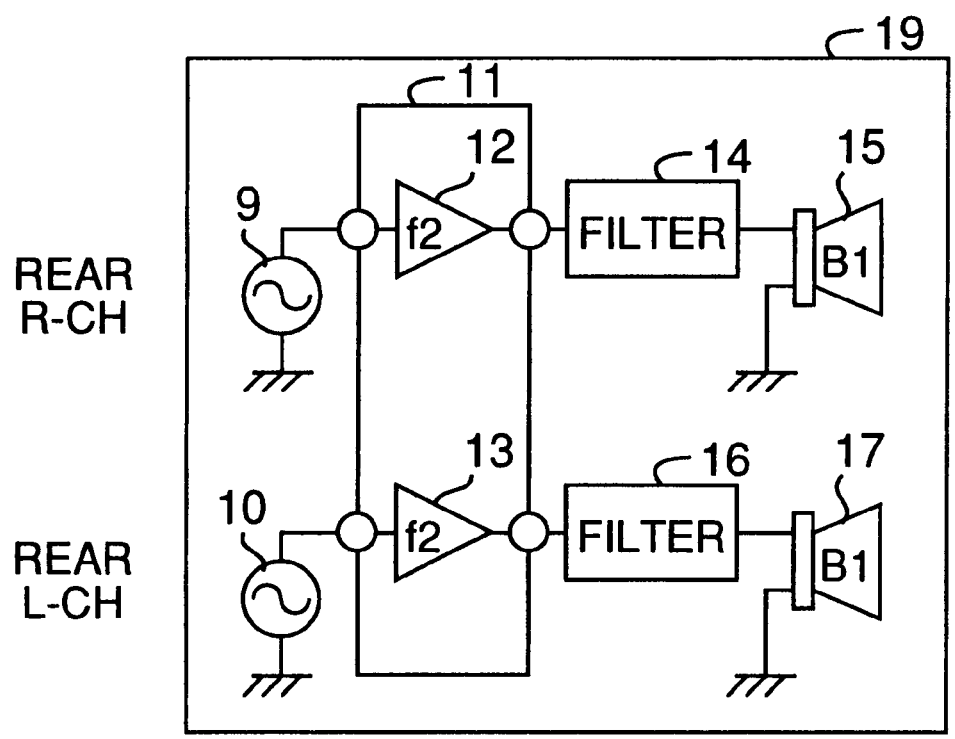

FIG. 3 is a schematic diagram of an audio amplifier system using a class D amplifier according to a third embodiment of the present invention. Note that an audio amplifier system according to this embodiment comprises two systems 18 and 19 as shown in FIG. 2 according to the second embodiment of the invention. As shown in FIG. 3, these two systems 18 and 19 are substantially identical, and differ only in that the first and second class D amplifiers 12 and 13 in the one system 18 both use the same modulation frequency f1, and the amplifiers 12 and 13 in the other system 19 both use the same modulation frequency f2.

An audio amplifier system as shown in FIG. 3 is thus configured for four-channel stereo reproduction. More specifically, the components 9, 12, 14, and 15 shown on the top row in system 18 as seen in FIG. 3 form a front right channel, and components 10, 13, 16, and 17 on the bottom in system 18 form a front left channel. The top row components 9, 12, 14, and 15 in system 19 similarly form a rear right channel, and bottom components 10, 13, 16, and 17 form a rear left channel.

In this system the difference between modulation frequency f1, which is the same in class D amplifiers 12 and 13 of system 18, and modulation frequency f2, which is the same in class D amplifiers 12 and 13 of system 19, is above the reproducible frequency band B1 of speakers 15 and 17. As a result, even if the beat component of modulation frequencies f1 and f2 produces an interference component when the signals from the four input signal sources 9 and 10 are amplified by the four class D amplifiers 12 and 13, the interference component will not be reproduced as audible noise by speakers.

It should be noted that the class D amplifiers 12 and 13 in system 18 can be designed to operate with the same modulation frequency f1 since they are integrated in a common IC and manufactured with very high care. Since the modulation frequencies are the same (f1) between class D amplifiers 12 and 13, no beat component will be reproduced by speakers 15 and 17. The same is also true in system 19. This is because the modulation frequency of the class D amplifiers 12 and 13 is precisely the same when the two class D amplifiers 12 and 13 are integrated into a single IC and manufactured with high care.

Embodiment 4

Figure 4:
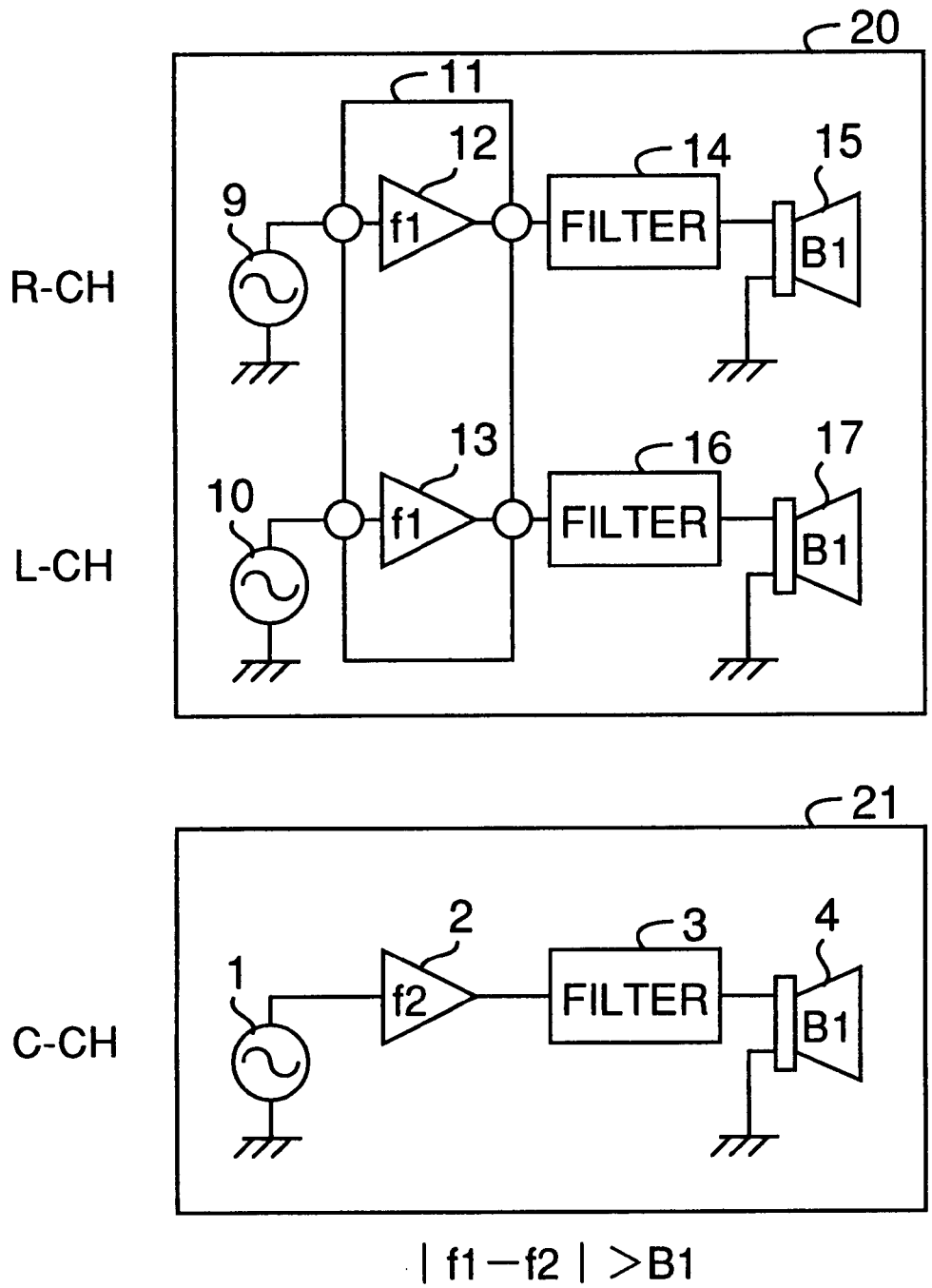
FIG. 4 is a schematic diagram of an audio amplifier system using a class D amplifier according to a fourth preferred embodiment of the present invention.

FIG. 4 is a schematic diagram of an audio amplifier system using a class D amplifier according to a fourth embodiment of the present invention. Note that an audio amplifier system according to this embodiment comprises two systems 20 and 21 where system 20 is identical to system 18 shown in FIG. 3, and system 21 comprises components 1 to 4 shown on the top in FIG. 1.

An audio amplifier system as shown in FIG. 4 is thus configured for three-channel stereo reproduction with components 9, 12, 14, and 15 shown on the top row in system 20 as seen in FIG. 4 forming a right channel, components 10, 13, 16, and 17 on the bottom in system 20 forming a left channel, and system 21 forming a center channel.

In this system, the difference between modulation frequency f1 of the class D amplifiers 12 and 13 in system 20, and modulation frequency f2 of the class D amplifier 2 in system 21, is above the reproducible frequency band B1 of speakers 4, 15, and 17. As described above, an interference component is therefore not produced when the supplied signals are amplified, and the speakers therefore have no interference component to reproduce as noise.

It should be noted that because the modulation frequency f1 of the two class D amplifiers 12 and 13 in system 20 is the same, the modulation frequency f1 and beat component thereof do not produce an interference component, and there is therefore no interference to be reproduced by the speakers 15 and 17.

Embodiment 5

Figure 5:
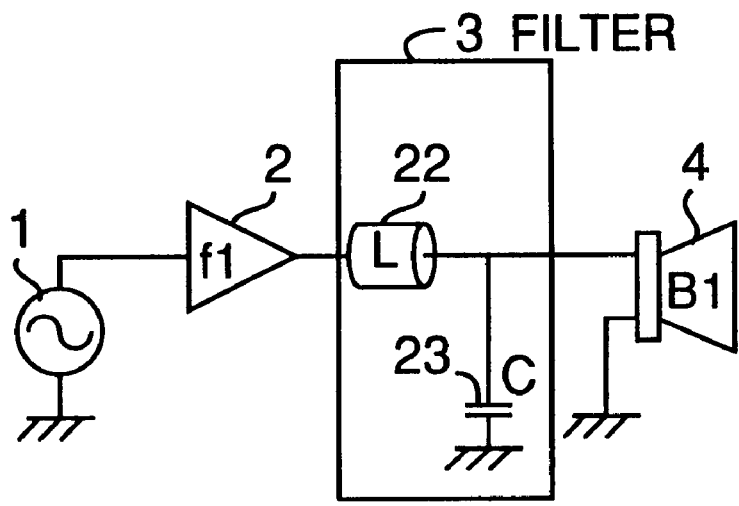
FIG. 5 is a schematic diagram of an audio amplifier system using a class D amplifier according to a fifth preferred embodiment of the present invention.

FIG. 5 is a schematic diagram of an integrator 3 according to a fifth embodiment of the present invention.

As shown in FIG. 5, this integrator 3 is an inductance-capacitance (LC) filter comprising a coil 22 connected in series between the first class D amplifier 2 and speaker 4, and a capacitor 23 connected between ground and the node between the coil 22 and speaker 4.

The coil 22 is magnetically shielded with a ferrite resin or silicon sheet to prevent magnetic leakage from the winding and core of the coil 22. Magnetic leakage when current flows to the coil 22 can be prevented by using an integrator 3 thus comprised to integrate high current level PWM signals. As a result, magnetic leakage can be prevented from interfering with other circuits.

It should be further noted that an integrator according to this fifth embodiment can be used in any of the other various embodiments of the present invention.

Embodiment 6

Figure 6:
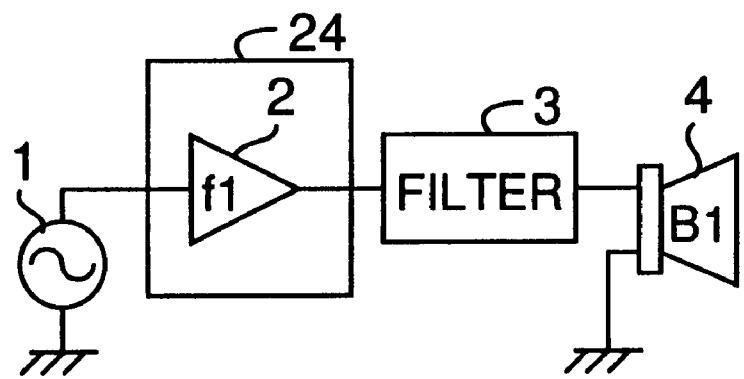
FIG. 6 is a schematic diagram of an audio amplifier system using a class D amplifier according to a sixth preferred embodiment of the present invention.

FIG. 6 is a schematic diagram of an audio amplifier system using a class D amplifier according to a sixth embodiment of the present invention. In this embodiment, class D amplifier 2 generating a high current level PWM signal is integrated into an IC device, which is magnetically shielded in package material 24 to prevent magnetic leakage from the class D amplifier 2 to other components. This package material 24 is a magnetic shield material such as a ferrite resin or silicon sheet.

Magnetic flux produced when the class D amplifier 2 operates and current flows can thus be prevented from leaking and interfering with other electronic circuits.

It will also be obvious that a class D amplifier according to this preferred embodiment of the invention can be used as a class D amplifier in any of the other various embodiments of the present invention.

As will be known from the above descriptions, an audio amplifier system using a class D amplifier according to the present invention reduces interference resulting from the use of a class D amplifier.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. An audio amplifier system comprising:
   a first source for producing a first source signal in a specific frequency band with a maximum frequency B0;
   a first class D amplifier which pulse wave modulates and amplifies said first source signal using a clock of a first modulation frequency f1 that is sufficiently high relative to frequency B0, and outputs a first PWM signal;
   a first filter for attenuating unwanted frequency components from said first PWM signal;
   a first speaker for receiving said first PMW signal and producing a first audible signal in a specific frequency band with a maximum frequency B1;
   a second source for producing a second source signal in a specific frequency band with a maximum frequency B0;

a second class D amplifier which pulse wave modulates and amplifies said second source signal using a clock of a second modulation frequency f2 that is sufficiently high relative to frequency B0, and outputs a first PWM signal;

a second filter for attenuating unwanted frequency components from said second PWM signal; and a second speaker for receiving said second PMW signal and producing a second audible signal in a specific frequency band with a maximum frequency B1;

wherein said first and second modulation frequencies f1 and f2 are preselected to satisfy the following relationship $$|f1-f2|>B1$$

whereby no audible interference is reproduced by said first and second speakers.

2. The audio amplifier system according to claim 1, wherein said first and second class D amplifiers are formed on a common IC device.

3. The audio amplifier system according to claim 1, wherein each of said first and second filters comprises a coil serially connected between the class D amplifier and the speaker, and a capacitor connected between ground and a node between the coil and the speaker.

4. The audio amplifier system according to claim 3, wherein said said class D amplifier has a magnetic shield for preventing leakage of magnetic flux emitted by the coil.

5. The audio amplifier system according to claim 4, wherein said magnetic shield is formed by a packaging material.

6. An audio amplifier system comprising:

a first source for producing a first source signal in a specific frequency band with a maximum frequency B0;

a first class D amplifier which pulse wave modulates and amplifies said first source signal using a clock of a first modulation frequency f1 that is sufficiently high relative to frequency B0, and outputs a first PWM signal;

a first filter for attenuating unwanted frequency components from said first PWM signal;

a first speaker for receiving said first PMW signal and producing a first audible signal in a specific frequency band with a maximum frequency B1;

a second source for producing a second source signal in a specific frequency band with a maximum frequency B0;

a second class D amplifier which pulse wave modulates and amplifies said second source signal using a clock of the first modulation frequency f1, and outputs a first PWM signal;

a second filter for attenuating unwanted frequency components from said second PWM signal;

a second speaker for receiving said second PMW signal and producing a second audible signal in a specific frequency band with a maximum frequency B1;

a third source for producing a third source signal in a specific frequency band with a maximum frequency B0;

a third class D amplifier which pulse wave modulates and amplifies said third source signal using a clock of a second modulation frequency f2 that is sufficiently high relative to frequency B0, and outputs a third PWM signal;

a third filter for attenuating unwanted frequency components from said third PWM signal;

a third speaker for receiving said third PMW signal and producing a third audible signal in a specific frequency band with a maximum frequency B1;

a fourth source for producing a fourth source signal in a specific frequency band with a maximum frequency B0;

a fourth class D amplifier which pulse wave modulates and amplifies said fourth source signal using a clock of the second modulation frequency f2, and outputs a fourth PWM signal;

a fourth filter for attenuating unwanted frequency components from said fourth PWM signal;

a fourth speaker for receiving said fourth PMW signal and producing a fourth audible signal in a specific frequency band with a maximum frequency B1;

wherein said first and second modulation frequencies f1 and f2 are preselected to satisfy the following relationship $$|f1-f2|>B1$$

whereby no audible interference is reproduced by said first, second and third, fourth speakers.

7. An audio amplifier system comprising:

a first source for producing a first source signal in a specific frequency band with a maximum frequency B0;

a first class D amplifier which pulse wave modulates and amplifies said first source signal using a clock of a first modulation frequency f1 that is sufficiently high relative to frequency B0, and outputs a first PWM signal;

a first filter for attenuating unwanted frequency components from said first PWM signal;

a first speaker for receiving said first PMW signal and producing a first audible signal in a specific frequency band with a maximum frequency B1;

a second source for producing a second source signal in a specific frequency band with a maximum frequency B0;

a second class D amplifier which pulse wave modulates and amplifies said second source signal using a clock of the first modulation frequency f1, and outputs a first PWM signal;

a second filter for attenuating unwanted frequency components from said second PWM signal;

a second speaker for receiving said second PMW signal and producing a second audible signal in a specific frequency band with a maximum frequency B1;

a third source for producing a third source signal in a specific frequency band with a maximum frequency B0;

a third class D amplifier which pulse wave modulates and amplifies said third source signal using a clock of a second modulation frequency f2 that is sufficiently high relative to frequency B0, and outputs a third PWM signal;

a third filter for attenuating unwanted frequency components from said third PWM signal;

a third speaker for receiving said third PMW signal and producing a third audible signal in a specific frequency band with a maximum frequency B1;

wherein said first and second modulation frequencies f1 and f2 are preselected to satisfy the following relationship $$|f1-f2|>B1$$

whereby no audible interference is reproduced by said first, second and third speakers.

* * * * *

UNITED STATES PATENT AND TRADEMARK OFFICE
CERTIFICATE OF CORRECTION

PATENT NO.    : 6,028,943
DATED         : February 22, 2000
INVENTOR(S)   : K. NAGATA It is certified that error appears in the above-identified patent and that said Letters Patent is hereby corrected as shown below:

At column 7, line 26 (claim 4, line 2) of the printed patent, delete "said" (second occurrence).

Signed and Sealed this

Twenty-seventh Day of March, 2001

Attest:

NICHOLAS P. GODICI

Attesting Officer

*Acting Director of the United States Patent and Trademark Office*